US008394661B2

(12) United States Patent
Grundmueller

(10) Patent No.: US 8,394,661 B2
(45) Date of Patent: Mar. 12, 2013

(54) STRUCTURING DEVICE FOR STRUCTURING PLATE-LIKE ELEMENTS, IN PARTICULAR THIN-FILM SOLAR MODULES

(75) Inventor: Richard Grundmueller, Lengenwang (DE)

(73) Assignee: InnoLas Systems GmbH, Krailling (DE)

( * ) Notice: Subject to any disclaimer, the term of this patent is extended or adjusted under 35 U.S.C. 154(b) by 923 days.

(21) Appl. No.: 12/495,993

(22) Filed: Jul. 1, 2009

(65) Prior Publication Data
US 2010/0009496 A1 Jan. 14, 2010

(30) Foreign Application Priority Data
Jul. 10, 2008 (DE) .......................... 10 2008 032 555

(51) Int. Cl.
*H01L 21/00* (2006.01)
*H01L 27/14* (2006.01)
*H01L 31/00* (2006.01)

(52) U.S. Cl. .............. 438/71; 438/57; 438/69; 257/431; 257/466; 136/265; 136/252

(58) Field of Classification Search .............. 438/57–98; 257/184–189, 431–466; 136/252–265
See application file for complete search history.

(56) References Cited

U.S. PATENT DOCUMENTS

| | | | | |
|---|---|---|---|---|
| 4,620,364 A | * | 11/1986 | Landis | 438/71 |
| 4,632,561 A | * | 12/1986 | Rosencwaig et al. | 356/432 |
| 5,131,954 A | * | 7/1992 | Vogeli et al. | 136/244 |
| 6,133,570 A | * | 10/2000 | Schimert et al. | 250/338.1 |
| 6,812,047 B1 | * | 11/2004 | Borden et al. | 438/16 |
| 6,911,349 B2 | * | 6/2005 | Li et al. | 438/16 |
| 2008/0121264 A1 | * | 5/2008 | Chen et al. | 136/244 |
| 2008/0286599 A1 | * | 11/2008 | Schonecker et al. | 428/573 |

FOREIGN PATENT DOCUMENTS

| | | |
|---|---|---|
| DE | 10 2006 051 556 | 5/2008 |
| JP | 2006-041322 | 2/2006 |

* cited by examiner

*Primary Examiner* — Fernando L Toledo
*Assistant Examiner* — Karen Kusumakar
(74) *Attorney, Agent, or Firm* — Fay Kaplun & Marcin, LLP

(57) ABSTRACT

A structuring device is for structuring a plate-like element. A solar module and/or a thin-film solar module comprises a plurality of structuring tools which are configured respectively for introducing a track into the plate-like element, characterised by a first structuring unit which has a plurality of these structuring tools, at least two structuring tools of this first structuring unit being configured such that two first tracks which extend parallel to each other and at a constant spacing from each other can be introduced into the plate-like element with said structuring tools (first track group SG1), and also a second structuring unit which has a plurality of these structuring tools, at least two structuring tools of this second structuring unit being configured such that two second tracks which extend parallel to each other and at a constant spacing from each other can be introduced into the plate-like element with said structuring tools (second track group SG2), the first and/or the second structuring unit being configured and/or being able to be controlled such that the spacing of the first track group from the second track group can be configured variably.

30 Claims, 4 Drawing Sheets

FIG 2
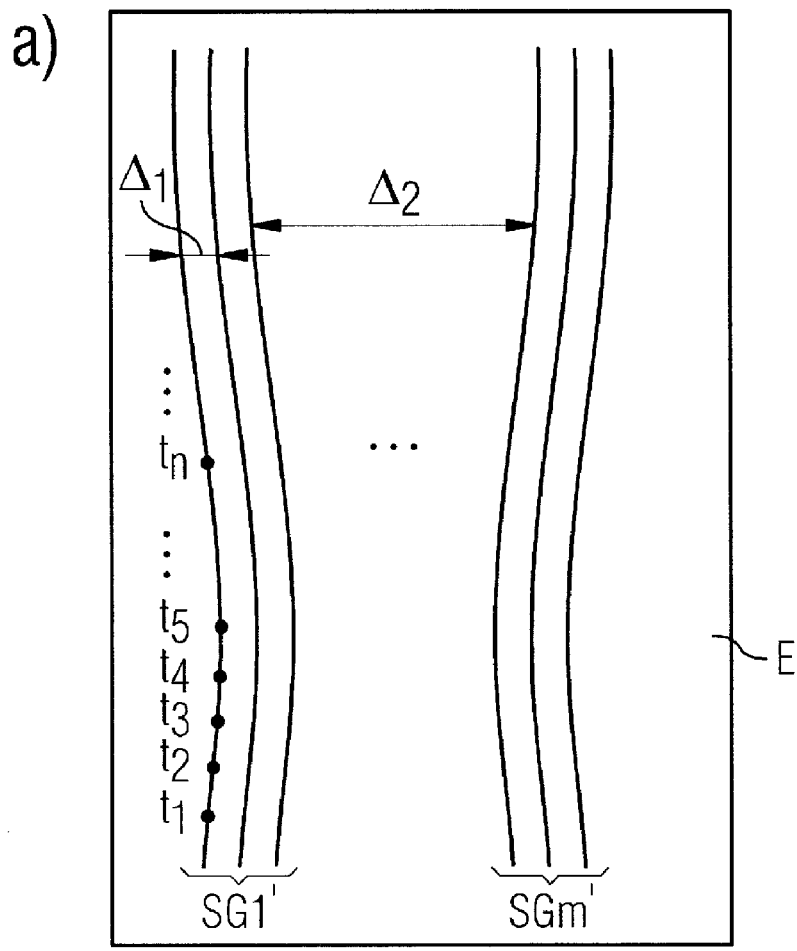
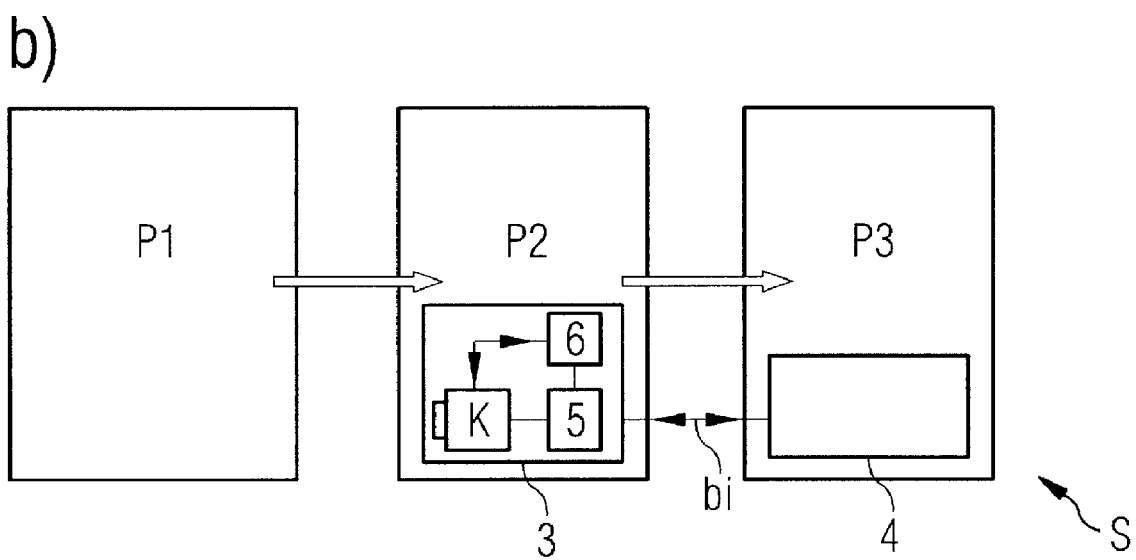

US 8,394,661 B2

STRUCTURING DEVICE FOR STRUCTURING PLATE-LIKE ELEMENTS, IN PARTICULAR THIN-FILM SOLAR MODULES

FIELD OF INVENTION

The present invention relates to a structuring device (and also to a corresponding structuring method) for structuring plate-like elements, in particular solar modules in the form of thin-film solar modules.

BACKGROUND INFORMATION

Copper-Indium-Diselenid (CIS) thin-film solar cells on glass substrates or on foil substrates have been used more and more widely in the last few years because of their flexibility, their lightness and their efficiency. One advantage of these thin-film solar modules is also the possibility of connecting individual cells electrically (usually in series) on a common electrically insulating substrate already during the production process. There are usually a plurality of structuring steps required thereby for such an electrical connection: after deposition of the rear contact (frequently made of molybdenum), the latter is divided into individual cells which are separated from each other electrically. After the intermediate layers (e.g. CIS absorbers, buffer layer and (i-) ZnO layer) have been applied, these layers must be cut through at the edge of the adjacent cell up to the molybdenum. In a further structuring step, the subsequently applied front contact (for example conductive ZnO:Al) must then be separated in order to split up the short-circuited cells again.

It is necessary for this plurality of structuring steps to introduce into the individual layers of the thin-film solar module a plurality of tracks which extend parallel to each other and at a constant spacing from each other. In order to introduce these tracks, according to the concrete profile requirements of such a track, either mechanical structuring tools (such as for example mechanical graving tools or scoring needles) or structuring tools in the form of laser machining units must be used. Introduction of tracks of this type into the layers of solar modules is described for example in DE 10 2006 051 556 A1.

A fundamental difficulty when introducing the tracks is based on the fact that the solar cell modules, during production thereof, must pass through a plurality of process steps which take place partially also at high temperatures. Thus for example the introduction of first parallel tracks into a first layer of a solar cell module (for example in the rear-side contact) is effected by means of a first machining device based on a laser head (or a plurality of laser heads which operate in parallel at a constant spacing from each other). In a further process step, the thus structured solar module passes through a high temperature step. Consequently, the result is a (slight) distortion of the solar module as a result of the temperature so that the tracks of the laser process step which are originally introduced to be parallel are no longer exactly parallel after the high temperature step. In a further, third process step (for example by means of a mechanical process step), parallel tracks are then intended to be structured in again into the solar module in a further layer (for example an intermediate layer). It is hereby crucial that these parallel tracks are structured in at precisely defined spacings and parallel to those tracks which were introduced in the first process step (laser process step).

SUMMARY OF INVENTION

The present invention relates to a structuring device for structuring plate-like elements, in particular thin-film solar modules, which allows, in a simple, efficient and reliable manner, the introduction of a plurality of further tracks into the plate-like element such that these further tracks or ones to be newly introduced are disposed at a defined spacing from (in particular parallel to and at a constant spacing from) tracks which have been structured already in the plate-like element.

The structuring device according to the present invention (or the structuring method according to the present invention) is described subsequently, firstly in general and then with reference to a special embodiment. The individual features which are produced in combination with each other in the embodiment need not thereby be present in precisely this combination but, within the scope of the present invention, can also be produced or used in any other combinations.

The present invention is based on the fundamental idea of dividing a large number of tracks which are already structured in the plate-like element respectively into a plurality of local close-up regions (of a single global track region) or of considering this plurality of local regions separately from each other. Subsequently, tracks already introduced into the plate-like element are designated fundamentally by a line at the top and the individual tracks of a local region are also termed track group. Thus for example all the tracks already structured in the plate-like element are subdivided into a plurality of (local) track groups SG1' to SGm', each track group of this type comprising a plurality of individual tracks (for example four to six individual tracks).

The distortions which are effected for example by temperature effects on the plate-like element with already introduced tracks can now be regarded approximately as follows: in the local close-up region, i.e. in the region of an individual track group SG', it can be assumed that the constant spacing of the individual tracks of one track group is approximately not impaired by the distortion. Approximately, all the tracks of one individual track group hence extend at a constant spacing from each other and parallel to each other. The course of an individual track of one such track group need not be present in the form of a straight line and generally also does not do this because of the distortion of the solar module: the individual tracks of one track group can hence extend perfectly well slightly curved, but parallel to each other and at a constant spacing.

Viewed globally, i.e. over all the track groups SG' of the plate-like element, the individual tracks of different track groups now lose their parallel course relative to each other or their course at a constant spacing from each other. In other words, respectively the individual tracks of the different track groups viewed within one and the same track group thereof in fact extend (approximately) parallel to each other, the individual tracks of different track groups (in particular track groups introduced far away from each other) no longer however extend parallel to each other but, because of their above-described distortions, display different courses or different curvature behaviour.

Based on this fundamental concept, the structuring device according to the invention now has a plurality (preferably: four to six) of structuring units which can be controlled independently of each other, each of these structuring units for its part comprising a plurality (preferably four to six) of individual structuring tools. The individual structuring tools of such a structuring unit can concern for example mechanical structuring tools, such as scoring heads with respectively one mechanical scoring needle, however as an alternative thereto also structuring tools in the form of laser machining units are conceivable, which then respectively have one laser with a subsequent optical system (for radiation of the laser beam onto the plate-like element).

The individual structuring tools of an individual structuring unit are thereby disposed preferably at a constant spacing from each other and fixed relative to each other such that, with the plurality of structuring tools of this structuring unit, a plurality of parallel tracks (at respectively a constant and equal spacing of adjacent tracks) can be introduced into the plate-like element.

The individual structuring tools of a structuring unit are configured in a preferred embodiment such that the extension, depth and/or the shape of the tracks which can be introduced can be controlled independently of each other: thus the contact pressure in particular of two structuring tools of one individual structuring unit in the form of scoring heads can be controlled independently of each other and hence one can react on different conditions occurring locally in the plate-like element flexibly.

The essential aspect of the realization according to the invention of the above-described basic concept now resides in the fact that the individual structuring units can be actuated and moved independently of each other. With each structuring unit, one track group can hence be structured into the plate-like element with respect to the course thereof independently of the course of the track groups of other structuring units. For this purpose, the individual structuring units can be provided respectively separately with individual motor controls so that the spacing respectively of adjacent structuring units can be varied during introduction of the respective track groups.

Hence, according to the invention, the courses of tracks already introduced into the plate-like element can be determined with a track detection unit (for example a camera with connected image processing device) and be evaluated with respect to the course thereof in that firstly the detected tracks are divided into track groups SG1' to SGm' (m=2, 3, 4, ... ) with respectively a plurality of individual tracks. There can then be assigned to each of these track groups a structuring unit with a number of structuring tools corresponding to the number of tracks of the respective track group. By means of a track control unit which actuates the individual structuring units, each structuring unit (independently of the other structuring units) can then be controlled as a function of the course of the track group SG' assigned thereto such that the tracks to be introduced anew with the structuring tools of the structuring unit (track group SG to be introduced anew) are introduced respectively parallel and at a constant spacing from the determined, already introduced tracks of the associated track group SG'.

The introduction of the different track groups SG1 to SGm (track groups to be introduced anew) is thereby effected by the independent actuation of the individual structuring units and the movement of these units independently of each other, i.e. at a variable spacing from each other. In the above-described manner, even if variable spacings occur, viewed perpendicular to the track direction, because of the above-described distortions between the individual, already introduced track groups SG1' to SGm', there can nevertheless be introduced for each individual track of each track group SG' a new track which is disposed parallel and at a constant spacing relative to the latter along the entire track course. Because of using a plurality of structuring units which can be moved and controlled independently of each other, the introduction of the new tracks which are orientated to the already introduced tracks can be effected easily and with high parallelism so that rapid introduction of a large number of tracks into the plate-like element to be machined is possible in the pre-defined manner.

The present invention is described subsequently with reference to an embodiment.

BRIEF DESCRIPTION OF DRAWINGS

There are shown in this respect:

FIG. 2 shows a plate-like element with already introduced tracks and also a plurality of successive process units of the structuring device according to an exemplary embodiment of the present invention.

DETAILED DESCRIPTION

Figure 1:
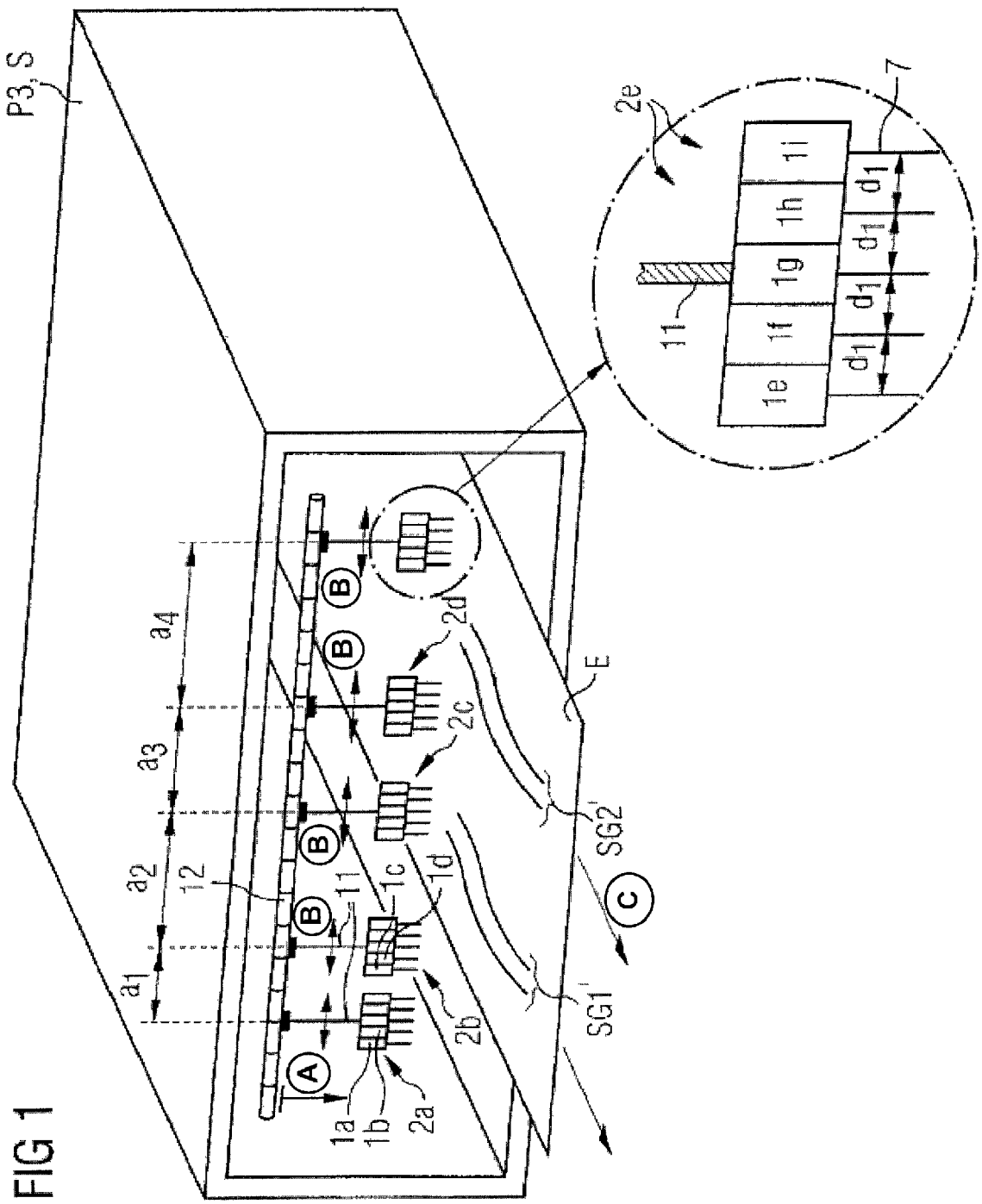
FIG. 1 shows a basic construction of the essential process unit of an structuring device according to an exemplary embodiment of the present invention.

FIG. 2b illustrates the basic construction of a structuring device according to the invention: in a first process unit P1, a plate-like element E to be machined in the form of a thin-film solar module, here CIS solar module (subsequently: solar module), is subjected to a first machining step. During this first machining step, a large number of tracks which are parallel to each other are structured into a first layer of the solar module (rear-contact layer). The structuring of these first tracks takes place here with a laser head which structures here for example in total 25 parallel tracks with respectively the same spacing between two adjacent tracks into the solar module (however also other numbers of tracks are of course possible).

Subsequently, the following is understood (as in the entire description of the invention) by the term spacing (see also FIG. 2a)): the spacing $\Delta_1$ between two adjacent individual tracks of a track group SG' (or in the case of track groups to be introduced anew: SG) at any support point of one of these tracks $t_i$ (i=1, 2, ..., n) is the minimum distance from this support point to the quantity of all possible support points of the other track (minimum spacing of one track from the adjacent track perpendicular to the course of the track). It is assumed in the following consideration that the spacings $\Delta_1$ of respectively adjacent tracks of one and the same track group SG' for all pairs of tracks of this track group and over the entire course of the tracks are approximately the same and constant along the plate-like element.

There is understood by the spacing $\Delta_2$ of two different track groups (for example the track group SG1' and the track group SGm' in FIG. 2a)), the minimum distance of any, however defined support point $t_i$ (i=1, 2, 3, ...) of a defined track of the one track group (e.g. SG1') to the quantity of all support points on the same track of the other track group (e.g. SGm'). The measurement of the spacing $\Delta_2$ of the track groups is thereby effected respectively between the same tracks of the respective track group, i.e. if every track group, e.g. as in the presented example, consists of respectively five individual tracks, then the spacing $\Delta_2$ between two track groups, is determined for example between respectively the first track of both track groups. It is now assumed in the subsequent consideration that the track spacing $\Delta_2$ between two different track groups SG' varies along the course of the individual tracks as a result of the above-described distortion effects, i.e. in contrast to the spacing $\Delta_1$ between two adjacent tracks within one track group does not remain constant.

Because of the high temperature step which is effected in the first process unit P1 after introduction of the first tracks for application of further layers (intermediate layers) of the solar module, the solar module E leaves the first process unit P1 in the form shown in FIG. 2a) in which the rear-contact layer of the module E has a plurality (here: 5 with respectively 5 tracks) of structured track groups SG1' to SGm' with spacings $\Delta_2$ which vary along the track course.

The second process unit P2 following the process unit P1 now serves for establishing the (distorted) track courses of the track groups SG': for this purpose, the process unit P2 of the structuring device according to the invention has a track detection unit 3 with which the tracks already present in the solar module E are detected with respect to their course or their position. For this purpose, the track detection unit 3 comprises a camera system K with which the track courses in the track groups SG1' to SGm' are photographed and are converted into a digital image. As an alternative thereto, a sensor which is designed for electrical effects (e.g. an eddy current probe) can also be used however to photograph track courses. By means of an image processing unit 5 subsequent to the camera K, the digital image showing the tracks is evaluated with pattern recognition methods which are known per se (e.g. edge detection methods). The evaluated information, in particular the spacings $\Delta_2$ of the different track groups SG' which vary along the track course are stored in a memory unit 6 of the track detection unit 3. Respectively the pair-wise spacings of adjacent track groups SG' can thereby be detected and stored as spacings $\Delta_2$; however it is of course also possible to detect and store respectively the spacing $\Delta_2$ from each further track group (SG2' to SGm') to the first track group SG'. As indicated in FIG. 2a), it is also not absolutely necessary to image and evaluate a digital image of the entire track course on the solar module E: if the process unit P2 is configured for example in the form of a transport device (for transport of the solar module E from the first process unit P1 to the third process unit P3), then it is sufficient to detect and evaluate the respective track course on a finite number of support points $t_i$ (i=1, 2, 3, ..., n, ...).

The information stored in the memory unit 6 of the track detection unit 3 relating to the track course of the individual, already introduced tracks of the track groups SG' is then made available to a track control unit 4 of the third process unit P3 subsequent to the second process unit P2. The information can hereby be made available either directly in the form of the above-described spacings $\Delta_2$ but it is also possible to make the information available in the form of reference/actual comparative values derived from these spacings or in the form of correction matrices which indicate the actual course of the individual tracks of the track groups relative to the ideal course of these tracks (parallelism and constant spacing of all individual tracks in module E). With the help of this information, the track control unit 4 of the third process unit P3 of the structuring device S according to the invention then controls, as described subsequently, the introduction of new tracks or track groups SG into the intermediate layers of the module E which are applied after the track structuring of the rear contact in the process unit P1. As FIG. 2b) indicates, the data exchange between the track detection unit 3 and the track control unit 4 of the structuring device S is configured to be bidirectional ("bi") so that information which can also be used for example for guiding the camera can be transmitted back from the track control unit 4 to the track detection unit 3.

FIG. 1 now shows the third process unit P3 of the structuring device S in detail. The track control unit 4 (computer system) which initiates and coordinates actuation of the individual elements 1, 2 is not shown here. Hence only the essential functional elements of this process unit are represented. As indicated by the arrows C, the solar module is transported in the direction of the track course of the already introduced track groups SG1' to SGm' (only two track groups are shown here). Such a transport device can concern for example an air-cushion table which is known per se and on the air cushion of which the solar module E is moved through the process unit P3. Alternatively thereto, the process units can also be moved over a stationary solar module E. The process unit P3 now has in total five individual, independent structuring units 2a to 2e. The structuring unit 2e is hereby illustrated enlarged on the right at the bottom in FIG. 1. Each of these structuring units 2a to 2e is suspended on a rail 12 which is disposed transversely relative to the transport direction by means of a moveable mounting 11. The individual structuring units 2a to 2e are hence disposed along the rail axis in a row at a spacing from each other. Each of the mountings 11 is provided with a motor unit (not shown) which can be actuated by the track control unit 4. The motor units of the individual structuring units can thereby be actuated respectively independently of each other and the individual structuring units can be moved respectively independently of each other along the longitudinal direction of the rail 12, i.e. perpendicular to the transport direction (arrows C). In this way, the spacings a (viewed along the rail longitudinal axis direction 12) respectively of adjacent structuring units can be adjusted respectively independently of each other: in the illustrated instantaneous photograph, the two structuring units 2a and 2b have for example a spacing $a_1$ which is approximately half as large as the spacing $a_2$ of the two structuring units 2b and 2c. The individual structuring units can hence be controlled independently of each other by means of the track control unit 4 and the motor units in the direction of the rail longitudinal direction 12 (see arrow direction B).

Each individual structuring unit 2 now has in total five structuring tools 1 (only two adjacent structuring tools 1a and 1b or 1c and 1d of the first two structuring units 2a and 2b and also the five structuring tools 1e to 1i of the last structuring unit 2e, illustrated enlarged, on the right in the picture are described separately here). The five individual structuring tools of the structuring units are configured here as mechanical structuring tools 1 in the form of scoring heads with respectively one mechanical scoring needle 7 (cf. FIG. 4). Adjacent scoring heads of one structuring unit 2 are thereby (cf. FIG. 1 at the bottom on the right) disposed in a fixed manner with respect to each other respectively at a constant, equal spacing. Two adjacent scoring needles 7 are hence disposed respectively at the same spacing $d_1$ relative to each other. The fixed spacing $d_1$ between respectively two adjacent scoring needles 7 of one structuring unit is in the present case for example 15 mm. With the help of the respective motor unit, each structuring unit 2 can be lowered perpendicular to the rail longitudinal axis direction (arrow direction B) and perpendicular to the feed or transport direction of the module E (arrow direction C) in the direction of the module E (arrow direction A).

Figure 3:
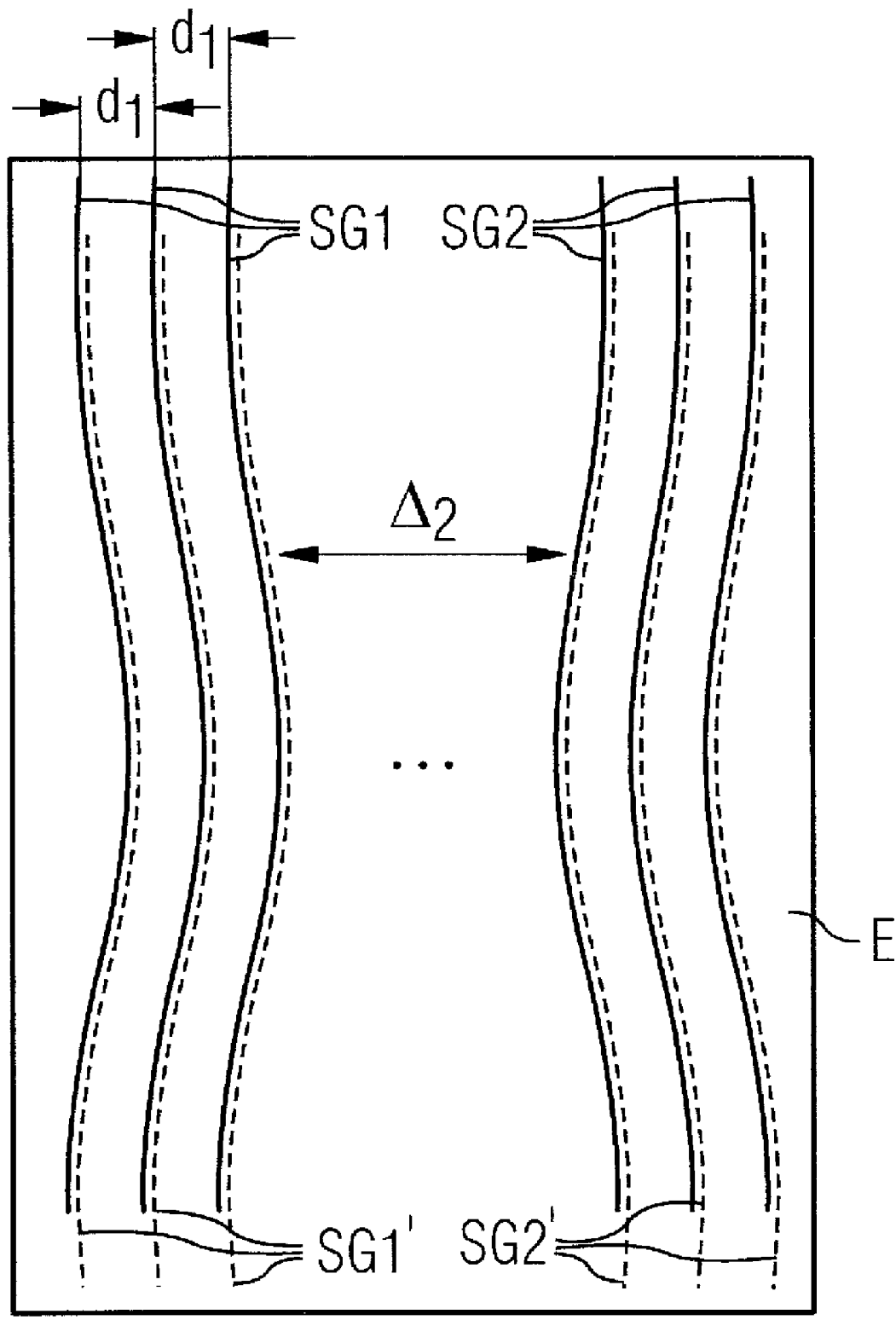
FIG. 3 shows the plate-like element of FIG. 2 into which, by means of the orientation on the course of already present tracks, new tracks have been structured.

The mode of operation of the process unit P3 of the structuring device S is now described with reference to FIGS. 1 and 3: the camera image of the already introduced tracks or track groups SG' is used by the track control unit 4 for actuation of the motor units of the individual structuring units 2. The individual structuring units 2 are lowered by means of the motor units onto the solar module E until there is contact with the same (arrow direction A). The contact forces of the tips of the scoring needles 7 of the individual structuring tools 1 can thereby be controlled (within one and the same structuring unit 2, just as also between different structuring units)

independently of each other according to the respectively locally occurring conditions (e.g. local hardness of the layer into which the respective track is intended to be introduced). By means of the track control unit 4, there is assigned to each already introduced track group SG' precisely one structuring unit 2 (for example there is assigned to the track group SG1' in FIG. 1 on the left the first structuring unit 2a). By means of the track course of an already present track group SG' which is determined from the camera image, the structuring unit 2 now assigned thereto is controlled such that the track group SG newly introduced by this structuring unit 2 is, with respect to the course thereof, exactly parallel to the course of the already introduced, associated track group SG' (cf. FIG. 3). Each individual track of a newly introduced track group SG therefore extends exactly parallel and at an exactly defined, constant spacing from its associated track of the already introduced track group SG'. As described above, it is hereby assumed that respectively adjacent tracks of the already introduced tracks of one track group SG' extend respectively parallel to each other and at a constant spacing from each other ($\Delta_1$ =constant). On the basis of the variable spacing control of the individual spacings $a_1$ to $a_4$ of respectively adjacent structuring units, these spacings can hence be adapted to the varying spacings $A_2$ of the individual track groups from each other: it is hence ensured for all track groups that all the tracks of one track group SG which are to be introduced anew extend respectively parallel and at a constant spacing to their associated tracks of an already introduced track group SG' although the spacings $A_2$ vary.

Figure 4:
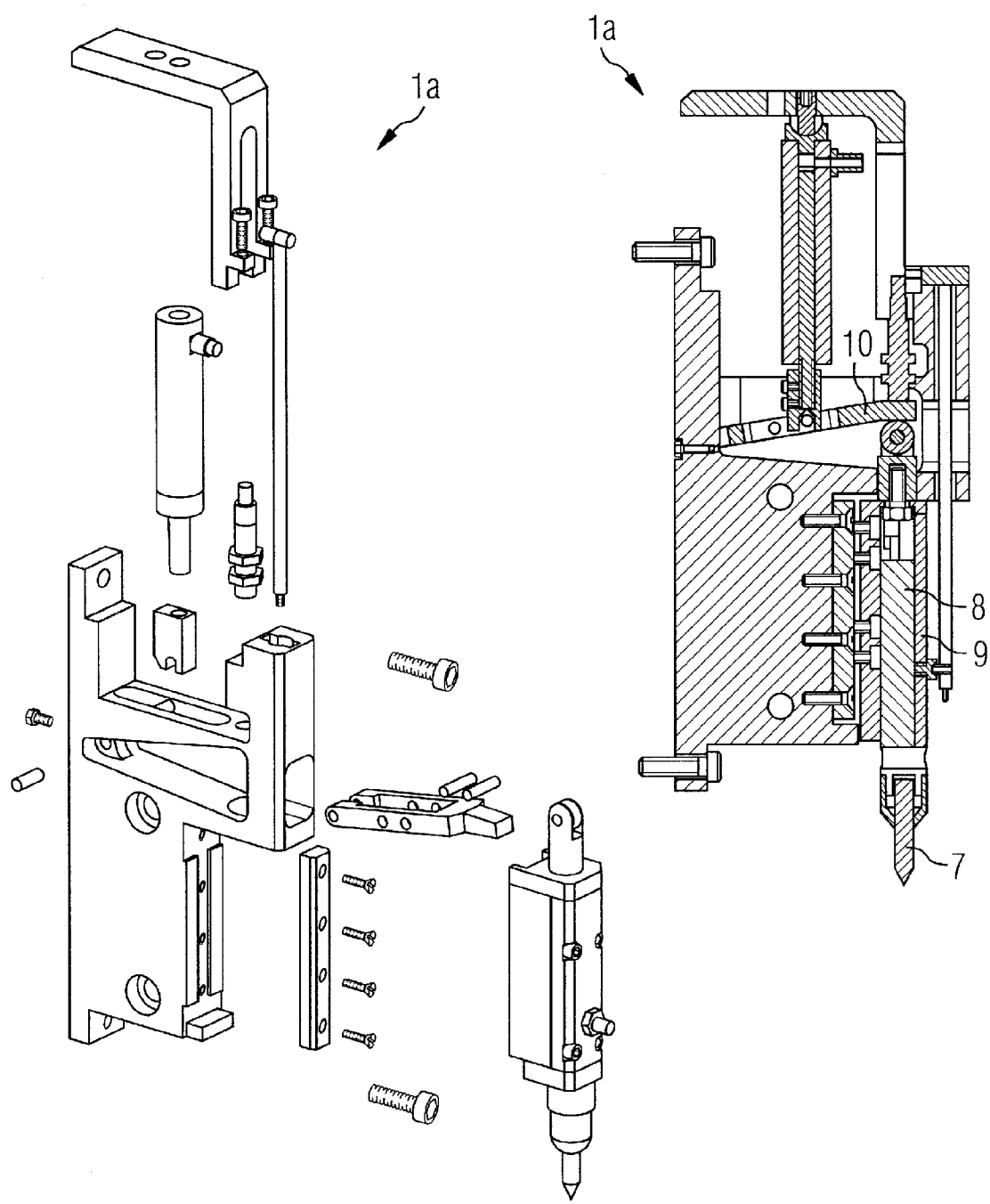
FIG. 4 shows an individual structuring tool of one structuring unit used in the embodiment of FIG. 1.

FIG. 4 shows an individual structuring tool 1 in the form of a scoring head with a mechanical scoring needle 7, as it is used in the above-described embodiment.

Actuation of a scoring needle 7 or establishing the contact pressure of this scoring needle 7 on the solar module E is achieved here by means of a needle control unit 8, 9, 10 (having a needle holder with adjustment function 8 which is configured within a slide 9 for vertical translatory movement of the needle). The unit 10 represents a lever arm with which the force region of the needle 7 can be adjusted according to the connection point.

The advantages of the present invention reside in particular in that a large number of tracks can be introduced into an already track-structured solar cell element in a simple and efficient manner, i.e. temporally in parallel, the newly introduced tracks being orientated to the course of the previous tracks. Furthermore, the present invention has the advantage that the camera image of the already introduced tracks, which is detected and evaluated by the track detection unit, can be made available in a simple manner for subsequent process units or structuring units of the structuring device. It is hence possible to assign an individual camera image to an individual solar module which is to be machined over all the process steps, by means of which camera image all the process steps subsequent to the first (track-structuring) process step can be controlled.

The invention claimed is:

1. A structuring device for structuring a plate-like element, comprising:
   a first structuring unit including a plurality of first structuring tools, at least two of the first structuring tools configured to introduce a first track group including two first tracks which extend parallel to each other and at a constant spacing from each other into the plate-like element; and
   a second structuring unit including a plurality of second structuring tools, at least two of the second structuring tools configured to introduce a second track group including two second tracks which extend parallel to each other and at a constant spacing from each other into the plate-like element,
   wherein at least one of the first and the second structuring units is at least one of configured and controllable to variably space the first track group from the second track group.

2. The structuring device according to claim 1, wherein the plate-like element is at least one of a solar module and a thin-film solar module.

3. The structuring device according to claim 1, further comprising: a third structuring unit including a plurality of third structuring tools, at least two of the third structuring tools configured to introduce a third track group including two third tracks which extend parallel to each other and at a constant spacing from each other into the plate-like element, wherein at least one of the first, the second, and the third structuring units is at least one of configured and controllable to variably space the third track group from the first and the second track group.

4. The structuring device according to claim 3, wherein the first, the second, and the third structuring units are disposed essentially in a row.

5. The structuring device according to claim 3, further comprising: at least a fourth structuring unit including a plurality of fourth structuring tools, at least two of the fourth structuring tools configured to introduce a fourth track group including two fourth tracks which extend parallel to each other and at a constant spacing from each other into the plate-like element, wherein at least one of the first, the second, the third, and the fourth structuring units is at least one of configured and controllable to variably space the fourth track group from the first, the second, and the third track group.

6. The structuring device according to claim 5, wherein at least one further respective track is included in the respective track group including the two respective tracks via the plurality of the respective structuring tools and wherein the at least one further respective track extends parallel to the two respective tracks and at a constant spacing from the two respective tracks.

7. The structuring device according to claim 1, wherein at least one of the first and second structuring tools is a mechanical structuring tool.

8. The structuring device according to claim 7, wherein the mechanical structuring tool is a scoring head with a mechanical scoring needle.

9. The structuring device according to claim 1, wherein at least one of the first and the second structuring tools comprises a laser machining unit.

10. The structuring device according to claim 9, wherein the laser machining unit comprises a laser with an optical system connected thereto and wherein the optical system comprises a light-conducting fibre to target radiation of a laser light generated with the laser onto the plate-like element.

11. The structuring device according to claim 1, further comprising: a track detection unit detecting features of the plate-like element; and a track control unit controlling an introduction of at least one of the first track group by the first structuring unit and the second track group by the second structuring unit as a function of the detected features.

12. The structuring device according to claim 11, wherein the detected features of the plate-like element include at least one of a course, a position, and a shape of at least one of the first tracks of the first track group and the second tracks of the second track group.

13. The structuring device according to claim 11, wherein the respective spacing of the first and the second track groups are variable from each other as a function of previously introduced tracks.

14. The structuring device according to claim 11, wherein the track detection unit has an optical detection unit with an image processing unit for an evaluation of images of the detected features.

15. The structuring device according to claim 14, wherein the optical detection unit is a camera system.

16. The structuring device according to claim 11, wherein the track detection unit has a memory unit storing data relating to the detected features, the introduction of the first and the second track groups being controllable by the first and the second structuring units, respectively, as a function of the stored data.

17. The structuring device according to claim 16, wherein the stored data includes at least one of digitized optical image data and recognized patterns of tracks.

18. The structuring device according to claim 1, wherein the spacing between the first track group and the second track group is a further spacing which is perpendicular to a direction of the respective tracks within one of the respective track group.

19. The structuring device according to claim 1, wherein the respective structuring tools of the respective structuring unit are controlled independently of each other with respect to at least one of an extension, a depth, and a shape of the respective tracks of the respective track group.

20. The structuring device according to claim 7, further comprising: a second mechanical structuring tool, wherein a contact force of the first and the second mechanical structuring tools is controlled independently of the other mechanical structuring tool.

21. The structuring device according to claim 9, wherein at least one of a beam energy, a radiation intensity and a temporal radiation profile of the laser machining unit is controlled independently of each other when more than one of the first and the second structuring tools include the laser machining unit.

22. A method for structuring a plate-like element, comprising:
introducing a first track group including two first tracks which extend parallel to each other and at a constant spacing from each other into the plate-like element using at least two of a first plurality of structuring tools of a first structuring unit; and
introducing a second track group including two second tracks which extend parallel to each other and at a constant spacing from each other into the plate-like element using at least two of a second plurality of structuring tools of a second structuring unit,
wherein at least one of the first and the second structuring units is at least one of configured and controllable to variably space the first track group from the second track group.

23. The structuring method of claim 22, wherein the plate-like element is at least one of a solar module and a thin-film solar module.

24. Use of a structuring device for structuring a plate-like element, the structuring device comprising:
a first structuring unit including a plurality of first structuring tools, at least two of the first structuring tools configured to introduce a first track group including two first tracks which extend parallel to each other and at a constant spacing from each other into the plate-like element; and
a second structuring unit including a plurality of second structuring tools, at least two of the second structuring tools configured to introduce a second track group including two second tracks which extend parallel to each other and at a constant spacing from each other into the plate-like element,
wherein at least one of the first and the second structuring units is at least one of configured and controllable to variably space the first track group from the second track group.

25. The use of the structuring device according to claim 24, wherein the first and second track groups are introduced into solar cell modules.

26. The use of the structuring device according to claim 25, wherein the solar cell modules are thin-film solar cell modules in a form of one of CIS and CIGS thin-film solar cell modules.

27. Use of a structuring method for structuring a plate-like element where the method comprises:
introducing a first track group including two first tracks which extend parallel to each other and at a constant spacing from each other into the plate-like element using at least two of a first plurality of structuring tools of a first structuring unit; and
introducing a second track group including two second tracks which extend parallel to each other and at a constant spacing from each other into the plate-like element using at least two of a second plurality of structuring tools of a second structuring unit,
wherein at least one of the first and the second structuring units is at least one of configured and controllable to variably space the first track group from the second track group.

28. The use of the structuring method according to claim 27, wherein the first and second track groups are introduced into solar cell modules.

29. The use of the structuring method according to claim 28, wherein the solar cell modules are thin-film solar cell modules in a form of one of CIS and CIGS thin-film solar cell modules.

30. The structuring device according to claim 14, wherein the detected features include pattern recognition of the previously introduced tracks.

* * * * *